United States Patent [19]

Muzyczko

[11] 4,225,661

[45] Sep. 30, 1980

[54] PHOTOREACTIVE COATING COMPOSITIONS AND PHOTOMECHANICAL PLATES PRODUCED THEREWITH

[75] Inventor: Thaddeus M. Muzyczko, Downers Grove, Ill.

[73] Assignee: The Richardson Company, Des Plaines, Ill.

[21] Appl. No.: 904,378

[22] Filed: May 10, 1978

Related U.S. Application Data

[63] Continuation of Ser. No. 732,112, Oct. 13, 1976, abandoned.

[51] Int. Cl.² .......................... G03C 1/52; G03F 7/02
[52] U.S. Cl. ................................... 430/156; 430/162; 430/287; 430/288; 430/292; 430/302; 430/333; 430/345; 430/346
[58] Field of Search .................... 96/68, 75, 33, 90 R, 96/90 PC

[56] References Cited

U.S. PATENT DOCUMENTS

| | | | |
|---|---|---|---|
| 3,042,515 | 7/1962 | Wainer | 96/90 R |
| 3,804,628 | 4/1974 | Osada et al. | 96/90 PC |
| 3,808,004 | 4/1974 | Thomas et al. | 96/75 |
| 3,923,524 | 12/1975 | Haase | 96/90 PC |
| 3,986,880 | 10/1976 | Wainer et al. | 96/90 PC |

FOREIGN PATENT DOCUMENTS

1154716  6/1969  United Kingdom ..................... 96/75

*Primary Examiner*—J. Travis Brown
*Attorney, Agent, or Firm*—Lockwood, Dewey, Alex & Cummings

[57] ABSTRACT

A photoreactive coating composition, particularly suited for use in a lithographic plate, is characterized by both reduced exposure time requirements and an intense visual image which is immediately produced upon exposure of the composition to light permitting visual inspection during imaging. The photoreactive composition has a diazo resin layer and an overlayer which includes a photochromic compound (e.g. an indolinobenzospiropyran compound) and a light sensitive polymer selected from the group cinnamoylated and acrylated photopolymer resins.

30 Claims, No Drawings

PHOTOREACTIVE COATING COMPOSITIONS AND PHOTOMECHANICAL PLATES PRODUCED THEREWITH

This is a continuation of application Ser. No. 732,112, filed Oct. 13, 1976, abandoned.

BACKGROUND AND DESCRIPTION OF THE INVENTION

This invention generally relates to photoreactive compositions useful in a wide variety of photomechanical processes and, more particularly, to photoreactive compositions which find advantageous utility as coatings for presensitized lithographic plates. In this regard, an important aspect of the present invention is particularly directed to the conjoint use of a water soluble diazo resin layer together with an overlayer which imparts both increased photospeed (i.e. substantially reduced required exposure time) and photochromism so that a visually perceptible image is immediately produced upon exposure of the composition to light.

Lithographic plates having a photopolymerizable coating over a diazo resin are described in the literature. For example, U.S. Pat. No. 3,808,004 describes a presensitized lithographic plate having a diazo resin layer in overlying relation to a support plate and a cinnamoylated resin photopolymer in overlying relation to the diazo layer. Such plates are characterized by rapid exposure speeds (they are typically ten times as fast as emulsion-developed diazo resin plates and fifty to one hundred time as fast as emulsion-developed photopolymer plates), long running on presses (as long running as conventional photopolymer plates and longer running than conventional lacquered diazo resin plates), and are easily and rapidly developed. These plates, however, are not characterized by photochromism, an important property which, if present, would permit a user to visually inspect the same during imaging, thereby facilitating layout and composition therewith.

While the use of photochromic compounds, such as, for example, the spiropyran compounds, in photoreactive compositions is known, heretofore such use with diazo resins has been thought to be counterproductive since the energy absorbed by the spiropyran compound operated to suppress the occurrence of photoreaction of the diazo compound. U.S. Pat. No. 3,804,628, for example, described a photosensitive composition which includes a cinnamoyl group and an indolinobenzospiropyran derivative together with a sensitizer. The indolinobenzospiropyran derivative generates image coloration immediately upon exposure thereby facilitating photocomposition and enabling lithographic plates incorporating the same to have portions thereof sequentially imaged without encountering problems such as double exposure and blank printing.

In addressing themselves to the use of these photochromic compounds with diazo compounds, however, the patentees in U.S. Pat. No. 3,804,628 note that since the photosensitive wave length region of the diazo compounds almost coincides with the photosensitive wave length region of the spiropyran compounds, a severe reduction in sensitivity of the diazo compound is encountered when a diazo is used in conjunction with a spiropyran compound. As such, this patent demonstrates the heretofore commonly accepted belief that these photochromic compounds could not be used with water soluble diazo resins and still result in a photoreactive composition which exhibited a satisfactory photospeed.

In accordance with an important aspect of the present invention, it has been discovered that the conjoint use of photochromic compounds, such as the spiropyran compounds, and water soluble diazo resins can be accomplished where the photochromic compound is incorporated in a cinnamoylated or acrylated photopolymer overlayer on the diazo resin without reduction in the high photospeeds obtainable through the use of the diazo resin and photopolymer.

It is, therefore, an important object of the present invention to provide an improved photoreactive composition which exhibits photochromism and which finds advantageous utility as a photoreactive coating for presensitized lithographic plates and other photomechanical plates.

Another object of the present invention is to provide a high speed water soluble diazo resin and photopolymer composition which is characterized by an intense visible image immediately upon being exposed to light such as, for example, through a suitable stencil.

Another object of the present invention is to provide an improved high speed water soluble diazo resin based photoreactive composition which immediately produces a dark image when exposed to light as opposed to a lightened image of the type commonly associated with conventional bleaching dye image technology.

Another object of the present invention is to provide an improved photoreactive composition which includes a water soluble diazo resin on which a photochromic material has been applied together with a cinnamoylated or acrylated photopolymer resin, which composition is characterized by substantially increased photospeeds when compared to unlacquered diazo and prelacquered diazo photoreactive compositions and equivalent photospeeds when compared to diazo resin compositions to which only a cinnamoylated photopolymer has been applied.

Another object of the present invention is to provide an improved water soluble diazo resin/photopolymer lithographic plate wherein the resulting image produced during exposure is preserved with the use of clear developers and without requiring the use of pigmented or dye-based developing systems.

Another object of the present invention is to provide an improved presensitized lithographic plate having a polymer coating system which is relatively transparent, thereby permitting more simplified coating techniques to be used and avoiding coating and handling problems commonly associated with highly colored polymer coating systems.

Another object of the present invention is to provide an improved presensitized lithographic plate exhibiting photochromism and characterized by high photospeeds (reduced exposure times) and which is long-running on presses, as long running as conventional photopolymer plates and longer running than conventional lacquered diazo resin plates.

Another object of the present invention is to provide an improved presensitized lithographic plate characterized by increased ink attractivity and improved background cleanliness.

These and other objects of the present invention will be apparent from the following description of some preferred embodiments.

In accordance with the present invention, an improved high-speed photoreactive composition is provided which finds advantageous utility as the photoreactive coating in a presensitized lithographic plate. In particular, the photoreactive coating compositions of the present invention produce an intense visual image immediately upon exposure to light and comprise a light-sensitive, water soluble diazo resin layer on which an overlayer coating which includes a photochromic compound and a light sensitive polymer selected from the group cinnamoylated and acrylated photopolymer resins has been applied. Generally, the spiropyrans such as, for example, the indolinobenzospiropyran compounds are the preferred photochromic materials and the cinnamate esters and acrylic esters are the preferred light sensitive photopolymers.

I have found that the thinner the diazo film, the faster the exposure speed. Typically, amounts of photochromic compound of from 1.5 to about 5 weight percent, based on the weight of the photopolymer, provide effective color intensity, although greater amounts of photochromic compound can be employed in the overlayer if desired.

In instances wherein the photosensitive composition of the present invention is used in the manufacture of lithographic plates, such plates will have a backing or support member of aluminum, zinc, paper, plastic or equivalent sheet material. Typically, examples of plastic films or sheets will be composed of polyvinyl chloride, polyvinyl acetate, polyolefins and the like. Aluminum sheets of sufficiently low gauge so as to be readily flexed, however, are the preferred backing member. The plate is treated to provide a hydrophilic surface before application of the diazo resin; also, the diazo resin requires protection from direct contact with the metal. Preferably, the plate is then coated with a sublayer or sub-base, many of which are commercially available. Suitable sub-bases, for example, include the phytic acid sub-base of U.S. Pat. No. 3,307,951, the melamine-formaldehyde condensation resin overcoated with a polyacrylamide, treated with zirconium acetate as in U.S. Pat. No. 3,073,723, the urea-formaldehyde sub-base of U.S. Pat. No. 3,136,636, the titanium ortho ester sub-base of U.S. Pat. No. 3,231,376, the silane-acrylic sub-base of U.S. Pat. No. 3,163,534, and the silicate sub-base of U.S. Pat. No. 2,714,066. In addition, other sub-bases are also satisfactory for many uses, including gelatin, polyacrylic acid and water-soluble salts thereof, polymethacrylic acid and water-soluble salts thereof, carboxymethyl cellulose, carboxymethyl hydroxyethyl cellulose, some titanates, modified resins of urea-formaldehyde and melamine-formaldehyde, polyvinyl alcohol, ferrocyanides or bichromates of sodium, potassium and ammonium, and the oxide of a metal forming the plate. Combinations of the foregoing materials are also suitable.

Any water-soluble diazo resin that is light sensitive may be used in the photoreactive composition of the present invention. Typical diazo resin sensitizers which are ideally suited for use in preparation of presensitized negative-working lithographic printing plates are described in U.S. Pat. Nos. 2,100,063, No. 2,667,415, No. 2,679,498 and No. 2,958,599. A preferred diazo resin of the negative-working type is prepared by condensing paraformaldehyde with p-diazo-diphenylamine sulfate as set forth in U.S. Pat. No. 2,100,063. The dispersion or solution of the sensitizer or light-sensitive diazo resin material may be applied to the prepared base, over the sub-base, by dipping, spraying, roller coating, brushing, or the like, all of which are conventional in this art.

Generally, any photochromic material which is reasonably transparent in the near ultraviolet region but which develops color upon irradiation with ultraviolet light may be employed as the photochromic compound in the photochromic/photopolymer overlayer. The spiropyrans represent a preferred class of photochromic compounds with the indolinobenzospiropyran compounds having been found to be especially suited for use as the photochromic material in the photochromic compound/photopolymer overlayer of the photoreactive compositions of the present invention. Illustrative materials which can be used as the photochromic constituents in the compositions of the present invention include: 1',3',3-trimethyl-6-nitrospiro-[2H-1-benzopyran-2,2'indoline],1,3,3-trimethyl-'-nitro-8'-methoxyspiro(indoline-2,2'-benzopyran), 1,3,3,5tetramethyl-6'nitrospiro(indoline-2,2'benzopyran), 1,3,3-trimethyl-5-methoxy-6'nitrospiro(indoline-2,2'-benzopyran), 1,3,3-trimethyl-5-carboethoxy-6'-nitrospiro(indoline-2,2'-benzopyran), 1,3,3-trimethyl-5-chloro-6'-nitrospiro(indoline-2,2'-benzopyran), 1β-carboxyethyl-3,3-dimethyl-6'nitrospiro(indoline-2,2'-benzopyran), 1-γ-carboethyoxypropyl-3,3-diemethyl-6'-nitrospiro (indoline-2,2'-benzopyran), and, 1-γ-cyanopropyl-3,3-dimethyl-6'-nitrospiro(indoline-2,2'-benzopyran). Of the foregoing materials, the 1',3',3'-trimethyl-6-nitrospiro-[2H-1-benzopyran-2,2'indoline] compound has been found to be highly satisfactory for use with cinnamate ester and acrylic ester photopolymers in the practice of this invention.

The cinnamoylated resins which can be employed in the photochromic compound/photopolymer layer of photoreactive compositions embodying the present invention can be generally described as oligomers and polymers having recurring pendant groups corresponding to the following structural formula:

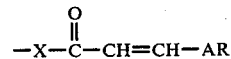

wherein "X" is S, O, or N-R with R being H or lower alkyl, and the "AR" group is intended to include all structures exhibiting aromaticity, including carbon ring structures such as, for example, phenyl and diphenyl; fused ring structures such as, for example, derivatives of napthalene, anthracene and phenanthrene; and, heterocylic structures such as, for example, derivatives of pyridine and furan. In the preferred embodiment of this invention, "X" is O and the "AR" group is phenyl.

Illustrative examples of cinnamate ester polymers which can be employed with the photochromic compound in the overlayer include polyvinyl cinnamate, phenoxy cinnamate, cinnamoylated cellulose, cinnamoylated allyl alcohol polymers, cinnamoylated alkoxylated novolacs, cinnamoylated hydroxyalkyl acrylate polymers, and cinnamoylated hydroxyalkyl methacrylate polymers. Specific examples of other such cinnamoylated resins and cinnamate esters are described in U.S. Pat. No. 3,808,004, No. 3,804,628, and No. 3,387,976. Especially preferred cinnamate esters are the phenoxy cinnamate polymers.

The acrylated resins which can be employed in the photochromic compound/photopolymer layer of photoreactive compositions embodying the present invention can be generally described as oligomers and polymers having recurring pendant groups corresponding to the following structural formula:

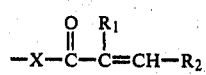

wherein "X" is S, O or N-R with R being H or lower alkyl, and $R_1$ and $R_2$ being the same or different and being selected from the class H and lower alkyl of from 1 to 12 carbon atoms. Preferably, "X" is O, $R_1$ is H or methyl, and $R_2$ is H.

Illustrative examples of acrylated photopolymer resins which can be employed with the photochromic compound in the overlayer include the acrylated or methacrylated: polyvinyl alcohol polymers, phenoxy resins, styrene-allyl alcohol copolymers, cellulose, starches, inositol, hydroxyalkyl acrylate polymers, novolac resins, alkoxylated novolac resins, polyvinyl amine polymers, epoxy resins, polythiols, polyvinylhydroxy aryl polymers, alkoxylated polyvinylhydroxy aryl polymers, allylamine polymers, and imine polymers (e.g. polyethylene imine, polypropyleneimine and deacetylated chitin). The acrylic ester polymers are preferred with the acrylated phenoxy resins such as acrylated bisphenol A-epichlorohydrin thermoplastic polymer the acrylated epoxy novolacs and the acrylated styrene-allyl alcohol polymers being found to be particularly desirable for use with indolinobenzospiropyran compounds in the overlayer on the diazo resin coating in the photoreactive compositions of the present invention.

It will be appreciated that the photochromic compound/photopolymer overlayer can also include other components such as flow modifying agents, plasticizers, surfactants, fillers, pigments, dyes, antihalation agents, sensitizers and the like to impart other desired properties thereto.

The following examples are presented to illustrate the photoreactive compositions and lithographic plates of the present invention.

EXAMPLE 1

An aluminum offset grade plate was brush grained, silicate sub-based, and coated with a solution of Fairmont's Diazo No. 4. This plate was then coated with the following solutions:

| Component | Parts By Weight | | |
|---|---|---|---|
| | A | B | C |
| Xylene | 96.5 | 96.5 | 96.5 |
| Phenoxy Cinnamate | 3.5 | 3.5 | 3.5 |
| Eastman 11417 Dye* (Photochromic Compound) | .035 | .0875 | .175 |
| Color Intensity | Low | Good | Good |

*1',3',3'-trimethyl-6-nitrospiro-[2H-1-benzopyran-2,2'-indoline]

As indicated by the table, Samples A, B, and C have photochromic compound concentrations of 1, 2.5 and 5.0 percent, respectively, based on the weight of phenoxy cinnamate polymer. Color intensity was good at photochromic compound levels as low as 2.5%. The exposed plates were successfully developed with a one-step red developing lacquer, Richardson's Hi-Contrast Red Developer. The resultant plates were clean running on the press. Exposed plates were also developed with Richardson's Subtractive Developer and these plates were also clean running on the press.

EXAMPLE 2

Plates were prepared as described in Example 1 except that the solvent used was methylcellosolve acetate and the base plate was anodized aluminum. The exposed plates showed a good contrast and were easily developed with subtractive and additive developers. Further, printed copies using these plates were clean and free of scum.

EXAMPLE 3

Part 1—Preparation of Partially Acrylated Phenoxy Resin

A solution of 50 grams of N-methyl pyrrolidone, 11.4 grams of Union Carbide PKHH Phenoxy Resin (bisphenol A-epichlorohydrin thermoplastic polymer, $MW_n$=approximately 20,000), and 1.1 grams of acryloyl chloride and 60 mg of hydroquinone was reacted at 70°–75° C. for 1½ hours. The polymer was precipitated into 2 liters of cold water. The isolated polymer was dried. The yield was 10.6 grams. The product was about 30 percent acrylated.

Part 2—Offset Printing Plate

An alloy 1100 aluminum sheet was brush grained, sub-based with sodium silicate, and coated with an aqueous solution of Fairmont's Diazo Resin #4. A 5 percent solution of the polymer in Part 1 of this example was dissolved in methyl cellosolve acetate and 0.25 percent Eastman 11417 Dye. A whirler was used to coat this solution. The plate was dried in an oven for two minutes at 210° F. This plate was then exposed to a 5 KW metal halide light source (Berkey Addalux Vacuum Printer) for 10 seconds. The negative employed consisted of 150 and 300 lines per inch screens, solids and a Stouffer 21 Step Sensitivity Guide. Upon exposure, a clean, visible image was noted. The plate was then developed with Richardson's Black One-Step lithographic plate developer. A solid step 6 was noted. The image was good and the background was clean. The plate was gummed and mounted on a Harris LUH sheet fed press. This press employed a conventional dampening system. A conventional black offset ink was used and the fountain solution consisted of Hydroetch and Hydrogum, fountain solution components marketed by Richardson Graphics. Clean copies were successfully printed.

EXAMPLE 4

Offset Printing Plate

An aluminum plate similar to that described in Example 3 was coated with a diazo resin as described in that Example. This plate was then overcoated with a 5 percent solution of Dow's XD 8031 (acrylated epoxy novolac) and 25 percent Eastman 11417 Dye in acetone. The coated and dried plate was exposed for 30 seconds in the unit described in Example 3. Upon exposure, a clear, visible image was noted. The plate was developed with Richardson's Black One-Step Developer. A solid step 9 was noted on the step wedge. The plate was gummed and mounted on the Harris LUH press and 5,000 copies were printed without image failure.

EXAMPLE 5

Part 1—Acrylation of Styrene-Allyl Alcohol Copolymer

A styrene-allyl alcohol copolymer (Monsanto RJ 100) was acrylated by using acrylic acid and the polymer in a toluene solution. The solution was azeotroprically distilled to remove the by-product water of esterification. Very little residual acid indicated that the esterification had been completed.

Part 2—Offset Printing Plate

A 4.5 percent solution of the polymer describe in Part 1 of this example was dissolved in methyl isobutyl ketone along with 0.25 percent Eastman 11417 Dye. A water soluble diazo resin plate similar to that described in Example 3 was overcoated with this solution using a whirler. The coated plate was dried for two minutes. The plate was then exposed in the exposure unit described in Example 3 using the same negative. Upon exposing for 30 seconds, a clear image was noted. The plate was developed with Richardson's Black One-Step Developer. A solid step 8 was noted on the step wedge. The image was sharp and the background was clean. The plate was mounted on a Harris LUH press and 5,000 copies were printed without failure. The rollup was particularly quick for this plate.

While in the foregoing specification certain embodiments and examples of this invention have been described in detail, it will be appreciated that modifications and variations therefrom will be apparent to those skilled in this art. Accordingly, this invention is to be limited only by the scope of the appended claims.

I claim:

1. A high-speed photomechanical presensitized plate suited for use as a lithographic plate and the like on which a visual latent image is produced immediately upon exposure to light, said plate comprising: a support member; a light sensitive, water soluble diazo resin layer over said support member; and, an overlayer coating on said diazo resin layer, said overlayer coating including in admixture, a photochromic compound and a light sensitive polymer selected from the group cinnamoylated and acrylated resins.

2. The plate of claim 1 wherein said light sensitive polymer is selected from the group cinnamate ester and acrylic ester photopolymers.

3. The plate of claim 1 wherein said photochromic compound is an indolinobenzospiropyran compound.

4. The plate of claim 3 wherein said indolinobenzospiropyran compound is selected from the group consisting of 1',3',3'-trimethyl-6-nitrospiro-[2 H-1-benzopyran-2,2'indoline], 1,3,3-trimethyl-6'-nitro-8'-methoxyspiro(indoline-2,2'-benzopyran), 1,3,3,5-tetramethyl-6'-nitrospiro(indoline-2,2'-benzopyran), 1,3,3-trimethyl-5methoxy-6'-nitrospiro(indoline-2,2'-benzopyran), 1,3,3-trimethyl-5-carboethoxy-6'-nitrospiro(indoline-2,2'-benzopyran), 1,3,3-trimethyl-5-chloro-6'-nitrospiro(indoline-2,2'-benzopyran), 1β-carboxyethyl-3,3-dimethyl-6'-nitrospiro(indoline-2,2'-benzopyran), 1-γ-carboethyoxypropyl-3,3-dimethyl-6'-nitrospiro (indoline-2,2-benzopyran), and, 1-γ-cyanopropyl-3,3-dimethyl-6'-nitrospiro(indoline-2,2'-benzopyran).

5. The plate of claim 3 wherein the photochromic compound is 1',3',3'-trimethyl-6-nitrospiro-[2H-1-benzopyran-2,2'-indoline].

6. The plate of claim 1 wherein the diazo resin is a condensation product of a p-diazodiphenylamine and formaldehyde.

7. The plate of claim 1 wherein said light sensitive polymer is selected from the group polyvinyl cinnamate, phenoxy cinnamate, cinnamoylated cellulose, cinnamoylated allyl alcohol polymers, cinnamoylated alkoxylated novolacs, cinnamoylated hydroxyalkyl acrylate polymers, and cinnamoylated hydroxyalkyl methacrylate polymers.

8. The plate of claim 1 wherein the light sensitive polymer is a cinnamoylated phenoxy resin.

9. The plate of claim 1 wherein said light sensitive polymer is an acrylated or methacrylated phenoxy resin.

10. The plate of claim 1 wherein said light sensitive polymer is an acrylated or methacrylated epoxy novolac.

11. The plate of claim 1 wherein said light sensitive polymer is an acrylated or methacrylated styrene-allyl alcohol copolymer.

12. A high-speed photomechanical presensitized plate suited for use as a lithographic plate and the like on which a visual latent image is produced immediately upon exposure to light, said plate comprising: a support member; a light sensitive, water soluble diazo resin layer over said support member; and, an overlayer coating on said diazo resin layer, said overlayer coating including in admixture, an indolinobenzospiropyran photochromic compound and a light sensitive polymer selected from the group cinnamate ester and acrylic ester photopolymer resins.

13. The plate of claim 12 wherein the photochromic compound is 1',3',3'-trimethyl-6-nitrospiro-[2H-1-benzopyran-2,2'-indoline].

14. The plate of claim 12 wherein the diazo resin is a condensation product of p-diazodiphenylamine and formaldehyde.

15. The plate of claim 12 wherein said light sensitive polymer is selected from the group polyvinyl cinnamate, phenoxy cinnamate, cinnamoylated cellulose, cinnamoylated allyl alcohol polymer, cinnamoylated alkoxylated novolacs, cinnamoylated hydroxyalkyl acrylate polymers, and cinnamoylated hydroxyalkyl methacrylate polymers.

16. The plate of claim 12 wherein the light sensitive polymer is a cinnamoylated phenoxy resin.

17. The plate of claim 12 wherein said light sensitive polymer is an acrylated or methacrylated phenoxy resin.

18. The plate of claim 12 wherein said light sensitive polymer is an acrylated or methacrylated epoxy novolac.

19. The plate of claim 12 wherein said light sensitive polymer is an acrylated or methacrylated styrene-allyl alcohol copolymer.

20. A high-speed photoreactive coating composition which is adapted to produce a visual latent image immediately upon exposure to light, said composition comprising: a light sensitive, water soluble diazo resin layer; and, an overlayer coating on said diazo resin layer, said overlayer coating including, in admixture, a photochromic compound and a light sensitive polymer selected from the group cinnamoylated and acrylated resins.

21. The composition of claim 20 wherein said light sensitive polymer is selected from the group cinnamate ester and acrylic ester photopolymers.

22. The composition of claim 20 wherein said photochromic compound is an indolinobenzospiropyran compound.

23. The composition of claim 20 wherein said indolinobenzospiropyran compound is selected from the group consisting of 1',3',3'-trimethyl-6-nitrospiro-[2H-1-benzopyran-2,2'-indoline], 1,3,3-trimethyl-6'-nitro-8'-methoxyspiro(indoline-2,2'-benzopyran), 1,3,3,5-tetramethyl-6'-nitrospiro(indoline-2,2'-benzopyran), 1,3,3- trimethyl-5-methoxy-6'nitrospiro(indoline-2,2'-benzopyran), 1,3,3-trimethyl-5-carboethoxy-6'-nitrospiro(indoline-2,2'-benzopyran), 1,3,3-trimethyl-5-chloro-6'-nitrospiro(indoline-2,2'-benzopyran), 1β-carboxyethyl-3,3-dimethyl-6'-nitrospiro (indoline-2,2'-benzopyran), 1-γ-carboethyoxypropyl-3,3-dimethyl-6'-nitrospiro (indoline-2,2'-benzopyran), and, 1-γ-cyanopropyl-3,3-dimethyl-6-nitrospiro(indoline-2,2'-benzopyran).

24. The composition of claim 20 wherein the photochromic compound is 1',3',3'-trimethyl-6-nitrospiro-[2H-1-benzopyran-2,2'-indoline].

25. The composition of claim 20 wherein the diazo resin is a condensation product of p-diazodiphenylamine and formaldehyde.

26. The composition of claim 20 wherein said light sensitive polymer is selected from the group polyvinyl cinnamate, phenoxy cinnamate, cinnamoylated cellulose, cinnamoylated allyl alcohol polymers, cinnamoylated alkoxylated novolacs, cinnamoylated hydroxyalkyl acrylate polymers, and cinnamoylated hydroxyalkyl methacrylate polymers.

27. The composition of claim 1 wherein the light sensitive polymer is a cinnamoylated phenoxy resin.

28. The composition of claim 20 wherein said light sensitive polymer is an acrylated or methacrylated phenoxy resin.

29. The composition of claim 20 wherein said light sensitive polymer is an acrylated or methacrylated epoxy novolac.

30. The composition of claim 20 wherein said light sensitive polymer is an acrylated or methacrylated styrene-allyl alcohol copolymer.

* * * * *

UNITED STATES PATENT AND TRADEMARK OFFICE
CERTIFICATE OF CORRECTION

PATENT NO. : 4,225,661
DATED : September 30, 1980
INVENTOR(S) : Thaddeus M. Muzyczko It is certified that error appears in the above-identified patent and that said Letters Patent are hereby corrected as shown below:

Column 2, line 49, "permiting" should read --permitting--

Column 4, line 15, "1,3,3-trimethyl-'-nitro-8'-methoxyspiro(in" should read --1,3,3-trimethyl-6'-nitro-8'-methoxyspiro(in--

Column 4, line 16, "1,3,3,5tetramethyl-6'nitros" should read --1,3,3,5-tetramethyl-6'-nitros--

Column 4, line 17, "(indoline-2,2'benzopyran)" should read --(indoline-2,2'-benzopyran)--

Column 4, line 22, "6'nitrospiro" should read --6'-nitrospiro--

Column 4, line 23, "diemethyl" should read --dimethyl--

Column 7, line 6, "describe" should read --described--

Column 7, line 50, "5methoxy" should read --5-methoxy--

Signed and Sealed this

Seventh Day of April 1981

[SEAL]

Attest:

RENE D. TEGTMEYER

Attesting Officer    Acting Commissioner of Patents and Trademarks